(12) United States Patent
Nagano et al.

(10) Patent No.: US 8,088,686 B2
(45) Date of Patent: Jan. 3, 2012

(54) METHOD OF REMEDYING DETERIORATION OF INSULATING FILM

(75) Inventors: Shuji Nagano, Tsuchiura (JP); Satoshi Hasaka, Oyama (JP); Minoru Inoue, Tokyo (JP); Toshinori Shibata, Tsukuba (JP)

(73) Assignee: Taiyo Nippon Sanso Corporation, Tokyo (JP)

( * ) Notice: Subject to any disclaimer, the term of this patent is extended or adjusted under 35 U.S.C. 154(b) by 373 days.

(21) Appl. No.: 12/226,422

(22) PCT Filed: Apr. 18, 2007

(86) PCT No.: PCT/JP2007/058427
§ 371 (c)(1),
(2), (4) Date: Oct. 17, 2008

(87) PCT Pub. No.: WO2007/123151
PCT Pub. Date: Nov. 1, 2007

(65) Prior Publication Data
US 2009/0099384 A1    Apr. 16, 2009

(30) Foreign Application Priority Data
Apr. 19, 2006 (JP) ................................. 2006-115900
Nov. 29, 2006 (JP) ................................. 2006-321603

(51) Int. Cl.
*H01L 21/4763* (2006.01)

(52) U.S. Cl. ......... 438/623; 558/274; 558/277; 568/948

(58) Field of Classification Search .................. 558/274, 558/277; 568/948; 438/623
See application file for complete search history.

(56) References Cited

U.S. PATENT DOCUMENTS

| 7,709,371 B2 * | 5/2010 | Bhanap et al. ................ 438/623 |
| 2004/0201007 A1 * | 10/2004 | Yagihashi et al. ................ 257/3 |
| 2005/0095840 A1 * | 5/2005 | Bhanap et al. ................ 438/623 |

FOREIGN PATENT DOCUMENTS

| JP | 2006-49798 | 2/2006 |
| WO | 2005/034194 | 4/2005 |

OTHER PUBLICATIONS

International Search Report for PCT/JP2007/058427 mailed Jul. 10, 2007.
"Silicon Technology", 2005, vol. 71, pp. 39 to 42.

* cited by examiner

*Primary Examiner* — Rei-tsang Shiao
(74) *Attorney, Agent, or Firm* — Nixon & Vanderhye P.C.

(57) ABSTRACT

The present invention provides a method of remedying deterioration of an insulating film which, during the remedial treatment of an insulating film deteriorated by plasma treatment, does not leave residual remedial agent on the wiring material such as the copper wiring layer, can be conducted using a dry process, and exhibits excellent applicability to mass production. The insulating film that has been deteriorated by plasma treatment is brought into contact with a remedial agent composed of a compound with a molecular structure having at least one of a nitro group and a carbonyl group, and at least one of a hydrocarbon group and a hydrogen group.

5 Claims, 6 Drawing Sheets

METHOD OF REMEDYING DETERIORATION OF INSULATING FILM

This application is the U.S. national phase of International Application No. PCT/JP2007/058427 filed 18 Apr. 2007 which designated the U.S. and claims priority to Japanese Patent Application Nos. 2006-115900 filed 19 Apr. 2006 and 2006-321603 filed 29 Nov. 2006, the entire contents of each of which are hereby incorporated by reference.

TECHNICAL FIELD

The present invention relates to a method of treating an interlayer insulating film used in a multilayer wiring structure of a semiconductor device such as a Si LSI Logic device, and relates particularly to a method of remedying deterioration of an insulating film, wherein deterioration (damage) of the electrical properties and film structure of the film caused by an etching treatment, ashing treatment or some other form of plasma treatment can be restored to the state that existed prior to the plasma treatment.

Priority is claimed on Japanese Patent Application No. 2006-321603, filed Nov. 29, 2006, and Japanese Patent Application No. 2006-115900, filed Apr. 19, 2006, the contents of which are incorporated herein by reference.

BACKGROUND ART $SiO_2$ (silicon dioxide) films having a dielectric constant of 3.9 to 4.0 have long been used as the insulating films such as interlayer insulting films within semiconductor devices, but in recent years, because miniaturization has progressed significantly and higher speeds and higher levels of performance are being demanded, dielectric constants of 3.0 or lower are now required, and the development of films that use materials based on either Si systems or organic systems that contain no Si is being actively pursued. Furthermore, recently, research and development into lowering the dielectric constant by introducing vacancies (pores) into films has also become very active.

However, these types of low dielectric constant insulating films composed of porous materials tend to have properties that include low mechanical strength for the film itself and low plasma resistance. As a result, when these types of insulating films are subjected to a plasma treatment such as a plasma film deposition treatment, a plasma ashing treatment, or a plasma etching treatment conducted during Cu/Low-k wiring processing, in the case of a Si-based material, the organic groups such as methyl groups that are bonded to the Si—O backbone of siloxane linkages that constitutes the majority of the insulating film tend to be cleaved and eliminated. Further, in the case of an organic film, organic groups or organic bonds tend to be cleaved. It is known that a phenomenon in which the electrical properties deteriorate markedly, with the dielectric constant of the insulating film increasing significantly, accompanies this type of alteration in the film structure.

In terms of a more detailed mechanism of how this deterioration in the electrical properties of the semiconductor device occurs, it is thought that silanol groups formed by small quantities of moisture in the atmosphere bonding to the Si active sites generated by organic group cleavage resulting from the above plasma treatment, namely the damaged Si sites, cause the film to change from a hydrophobic state to a hydrophilic state, and as a result, further moisture adsorption occurs, thereby causing a deterioration in the electrical properties associated with Cu diffusion and an increase in the dielectric constant of the insulating film.

As a method of restoring, as far as possible, an insulating film that has been subjected to this type of deterioration to the state that existed prior to the plasma treatment, a method is disclosed in "Silicon Technology", 2005, vol. 71, pp. 39 to 42 in which a porous siloxane-based insulating film that has been deteriorated by plasma treatment is subjected to a heat treatment at 400° C. in an atmosphere of a remedial agent composed of 1,3,5,7-tetramethylcyclotetrasiloxane (TMCTS).

Furthermore, as another remedial method, a TA treatment method in which a liquid remedial agent is applied to an insulating film that has been deteriorated, and a heat treatment is then performed at approximately 350° C. has been proposed by Honeywell Inc., U.S.A.

However, in the first remedial method, there is a chance that the remedial agent used during the remedial treatment may remain on the copper wiring layer, resulting in an increase in the contact resistance of contact sections where the remedial agent covers the copper as a coating, and causing deterioration in the electrical properties.

Further, in the second method, an extra step of applying the liquid remedial agent is required, meaning an increase in the number of apparatus required for producing the device and an increase in the number of process steps, which is problematic in terms of mass production.

DISCLOSURE OF INVENTION

Accordingly, an object of the present invention is to provide a method of remedying deterioration of an insulating film which, during the remedial treatment of deterioration of an interlayer insulating film, does not leave residual remedial agent on the wiring material such as the copper wiring layer, can be conducted using a dry process, and exhibits excellent applicability to mass production.

In order to achieve this object, a first aspect of the present invention is a method of remedying deterioration of an insulating film, the method comprising bringing an insulating film that has been deteriorated by plasma treatment into contact with at least one remedial agent comprising a compound with a molecular structure having at least one of a nitro group and a carbonyl group, and at least one of a hydrocarbon group and a hydrogen group.

A second aspect of the present invention is a method of remedying deterioration of an insulating film according to the first aspect, wherein following plasma treatment, a substrate having the insulating film is subjected to a remedial treatment without exposure to an external atmosphere.

A third aspect of the present invention is a method of remedying deterioration of an insulating film according to the first aspect, wherein a penetration promoting agent is brought into contact with the deteriorated insulating film, either prior to, or simultaneously with, a remedial treatment.

A fourth aspect of the present invention is a method of remedying deterioration of an insulating film according to the third aspect, wherein the penetration promoting agent is at least one compound selected from the group consisting of alcohol compounds and ether compounds.

A fifth aspect of the present invention is a remedial agent for an insulating film, comprising a compound with a molecular structure having at least one of a carbonyl group and a nitro group, and at least one of a hydrocarbon group and a hydrogen group.

A sixth aspect of the present invention is a remedial agent for an insulating film according to the fifth aspect, wherein the remedial agent is a compound with a carbonate ester structure.

A seventh aspect of the present invention is a remedial agent for an insulating film according to the fifth aspect, wherein the remedial agent is a compound with a diketone structure.

An eighth aspect of the present invention is a remedial agent for an insulating film according to the fifth aspect, wherein the remedial agent is a compound with a β-diketone structure.

A ninth aspect of the present invention is a remedial agent for an insulating film according to the fifth aspect, wherein the remedial agent is a compound with a carboxyl structure.

A tenth aspect of the present invention is a remedial agent for an insulating film according to the fifth aspect, wherein the remedial agent is a compound with an aldehyde structure.

An eleventh aspect of the present invention is a remedial agent for an insulating film according to the fifth aspect, wherein the remedial agent is a compound with a carboxylic anhydride structure.

According to the present invention, silanol groups generated as a result of plasma treatment are eliminated by the remedial treatment, and the dielectric constant of the deteriorated insulating film can be restored almost completely to the value prior to the plasma treatment. Furthermore, the by-products generated by the reaction between the deteriorated insulating film and the remedial agent are compounds such as carbon dioxide and oxygen that are gases at normal temperatures, meaning the remedial agent or reaction products thereof do not remain on the wiring material, and impart no adverse effects on subsequent processes. Moreover, because the remedial treatment can be conducted as a dry process, it exhibits excellent applicability to mass production.

BEST MODE FOR CARRYING OUT THE INVENTION

Figure 1:
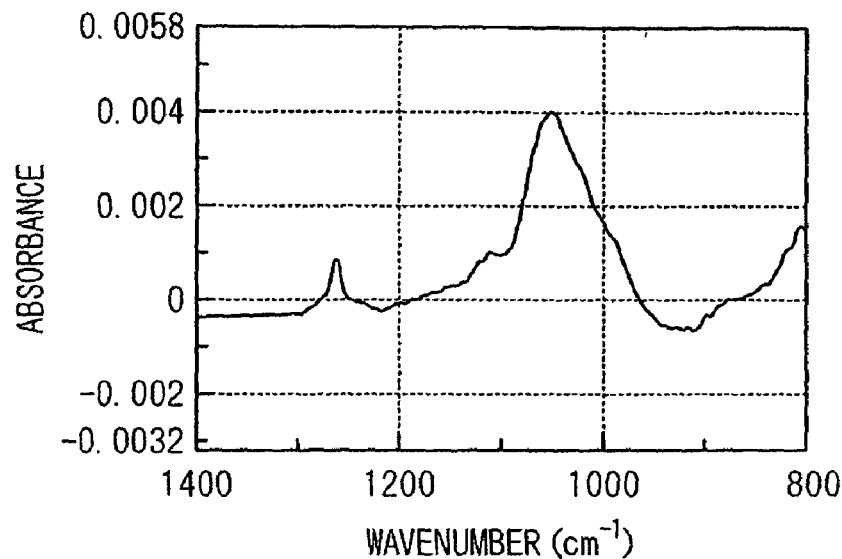
FIG. 1 is an IR (infrared absorption) spectrum showing results of Example 1.

An insulating film that functions as the treatment target for a remedial treatment of the present invention is a film in which a series of processes associated with the production of a semiconductor device causes an increase in one of the components (electronic polarization, ionic polarization and orientation polarization) that constitute the dielectric constant of the film. Films that have been subjected to a plasma treatment such as plasma-enhanced CVD (PE-CVD), plasma etching treatment or plasma ashing treatment represent particular treatment targets. In these insulating films, the various plasma treatments used for fabricating the multilayer wiring structures of a semiconductor device cause cleavage and detachment of organic bonds such as methyl groups within the films, and particularly within insulating films composed of Si-based materials, resulting in an increase in the polarization component within the film, and an increase in the dielectric constant.

Furthermore, the insulating film of the treatment target may be any film formed using a Si-based material or a hydrocarbon-based material as a starting raw material. Moreover, the film need not necessarily be formed using a CVD method or coating method, and the film may also be porous or not.

Furthermore, as described above, the treatment target is a film in which organic groups such as methyl groups bonded to the Si that constitutes the insulating film composed of a Si-based material are cleaved and eliminated, forming active sites such as Si dangling bonds, and these active sites then bond with moisture in the atmosphere to generate silanol groups, causing the film to change from a hydrophobic state to a hydrophilic state.

Of these types of insulating films, the films for which the most marked effect is observed upon conducting a remedial treatment are low dielectric-constant insulating films composed of a Si-based material such as porous SiOCH in which Si dangling bonds have been formed but generation of silanol groups via bonding with moisture in the atmosphere is yet to occur.

This type of insulating film is a film having a thickness of 10 to 10,000 nm that has been deposited on top of a substrate composed of Si or the like in order to form a semiconductor element, and in the remedial treatment, it is the substrate that functions as the actual treatment target.

Of the remedial agents that can be used in the remedial method of the present invention, those compounds with a carbonate ester structure or a diketone structure have a particularly prominent remedial treatment effect, and of compounds with a diketone structure, β-diketone compounds are particularly desirable. Moreover, compounds having a structure in which a portion of the hydrocarbon groups or hydrogen groups have been substituted with fluorine atoms can also be used.

A methyl group or hydrogen group bonded to a carbon or oxygen atom adjacent to a ketone group is readily detached due to the polarity of the ketone group, and in the remedial treatment, a reaction occurs in which this detached methyl group or hydrogen group bonds to a damaged site within the deteriorated film.

Specifically, examples of the remedial agent include compounds represented by Chemical Formulas (1) to (15) shown below.

$$(C_aH_bO)(C_cH_dO)CO \quad (1)$$

wherein, a, b, c and d are integers in which a=1 to 6, b=3 to 13, c=1 to 6, and d=3 to 13.

$$(C_aF_bO)(C_cH_dO)CO \quad (2)$$

wherein, a, b, c and d are integers in which a=1 to 6, b=3 to 13, c=1 to 6, and d=3 to 13.

$$(C_aH_bO_2)CO \quad (3)$$

wherein, a and b are integers in which a=1 to 6 and b=2 to 12.

$$(C_aF_bO_2)CO \quad (4)$$

wherein, a and b are integers in which a=1 to 6 and b=2 to 12.

$$(C_aH_b)NO \quad (5)$$

wherein, a and b are integers in which a=1 to 6 and b=3 to 13.

$$(C_aH_b)(C_cH_d)CO \quad (6)$$

wherein, a, b, c and d are integers in which a=1 to 6, b=3 to 13, c=0 to 6, and d=1 to 13.

$$((C_aH_b)_3C)((C_cH_d)_3C)CH_2(CO)_2 \quad (7)$$

wherein, a, b, c and d are integers in which a=0 to 6, b=3 to 18, c=0 to 6, and d=3 to 18.

$$((C_aF_b)_3C)((C_cF_d)_3C)CH_2(CO)_2 \quad (8)$$

wherein, a, b, c and d are integers in which a=0 to 6, b=3 to 18, c=0 to 6, and d=3 to 18.

$$((C_aH_b)O)((C_cH_d)O)CH_2(CO)_2 \quad (9)$$

wherein, a, b, c and d are integers in which a=1 to 6, b=3 to 18, c=1 to 6, and d=3 to 18.

$$((C_aH_b)_3C)CHO \quad (10)$$

wherein, a and b are integers in which a=0 to 6 and b=3 to 13.

$$((C_aH_b)O)CHO \quad (11)$$

wherein, a and b are integers in which a=1 to 6 and b=3 to 13.

$$(C_aH_b)CHO \quad (12)$$

wherein, a and b are integers in which a=0 to 6 and b=1 to 13.

$$(C_aH_b)COOH \quad (13)$$

wherein, a and b are integers in which a=0 to 6 and b=1 to 13.

$$(C_aH_b)COO(C_cH_d) \quad (14)$$

wherein, a, b, c and d are integers in which a=0 to 6, b=1 to 13, c=0 to 6, and d=1 to 13.

$$(C_aH_bCO)_2O \quad (15)$$

wherein, a and b are integers in which a=0 to 6 and b=1 to 13.

Examples of specific compounds include dimethyl carbonate, diethyl carbonate, diphenyl carbonate, propylene carbonate, difluoromethyl carbonate, 2,2,6,6-tetramethyl-3,5-heptanedione, 2,2,6,6-tetrafluoromethyl-3,5-heptanedione, 2,2,6,6-tetraethyl-3,5-heptanedione, 2,2-dimethyl-3,5-hexanedione, 2,2-diethyl-3,5-hexanedione, 2,2-dimethyl-3,5-pentanedione, 2,2-diethyl-3,5-pentanedione, acetone, methyl ethyl ketone, methyl propyl ketone, diethyl ketone, 2-hexanone, 3-hexanone, acetonylacetone, mesityl oxide, phorone, acetylacetone, hexafluoroacetone, nitromethane, nitroethane, nitropropane, acetaldehyde, propionaldehyde, butyraldehyde, valeraldehyde, caproaldehyde, heptaldehyde, acrolein, crotonaldehyde, 1,2,4-1H triazole, formaldehyde, formic acid, acetic acid, acetic anhydride, formic anhydride, methyl formate, ethyl formate and ditertial butyl dicarbonate.

The method of remedying deterioration according to the present invention involves bringing an aforementioned compound into contact with the deteriorated insulating film. The method used for bringing the remedial agent into contact with the film may employ either a gas or a liquid. In a specific example of the method, the substrate such as a Si substrate with an insulating film formed thereon that functions as the remedial treatment target is placed inside the chamber of a remedial treatment apparatus, a vapor of an aforementioned compound is introduced into the chamber, and this vapor is brought into contact with the insulating film inside the chamber.

In those cases where the vapor pressure of the compound is low, the compound may be carried in a gas phase by either bubbling a carrier gas through the compound or using a vaporizer, and subsequently supplied to the chamber. The quantity of vapor supplied is typically within a range from approximately 10 to 1,000 sccm, although the quantity is not strictly limited to a value within this range, and may be altered as desired.

The reaction temperature inside the chamber is not more than 500° C., and is preferably within a range from 20 to 300° C. If the temperature exceeds 500° C., then elimination of methyl groups from within the film accelerates. Furthermore, the pressure inside the chamber is not more than 100 kPa, and is preferably within a range from 1 to 8,000 Pa. If the pressure exceeds 8,000 Pa, then the treatment time required for the remedial process may become excruciatingly lower during mass production. Moreover, in the case of a single-wafer treatment, the treatment time is preferably within a range from 0.1 to 10 minutes. If the time exceeds 10 minutes, then the throughput of the remedial treatment apparatus becomes excruciatingly lower. In contrast, in the case of a batch treatment, because the number of substrates treated in a same batch is large, this treatment time limit does not apply.

Furthermore, examples of contact methods that accelerate the remedial treatment, besides methods that use heating, include methods that include irradiation with ultraviolet radiation, infrared radiation or an electron beam, and methods that employ a plasma generated by high frequency. Because the remedial reaction is dependent on the partial pressure of the remedial agent, the remedial agent may be diluted with He, Ar or $N_2$ or the like.

In addition, by using a penetration promoting agent, either prior to conducting the remedial treatment or at the same time as the remedial treatment, a further improvement in the level of deterioration restoration can be achieved.

The remedial treatment is conducted in a heated atmosphere of not more than 500° C. However, if heating is conducted without the remedial agent having dispersed into the interior of the deteriorated film, then silanol groups in the interior of the deteriorated insulating film may undergo a dehydration-condensation, meaning the networked Si—O bonds that contribute to lowering the dielectric constant cannot be retained.

The penetration promoting agent diffuses readily into the interior of the deteriorated film, thereby accelerating the diffusion of the remedial agent during the remedial treatment. Moreover, because the penetration promoting agent suppresses the condensation reaction between silanol groups, factors that can impede deterioration restoration such as the generation of active sites or changes to the backbone structure can be suppressed.

This type of penetration promoting agent r typically includes at least one compound selected from the group consisting of alcohol compounds and ether compounds, and specific examples of preferred compounds include ethanol, isopropanol, methanol, butanol, ethylene glycol, tetrahydrofuran, dimethyl ether, and methyl ethyl ether.

The penetration promoting agent can be used either prior to the remedial treatment or at the same time as the remedial treatment, and is used during a similar heat treatment to the remedial treatment, at a temperature of not more than 500° C., and preferably at a temperature within a range from 20 to 300° C. When the penetration promoting agent is used prior to the remedial treatment, the heat treatment is preferably conducted at a temperature of not more than 100° C.

The quantity used of the penetration promoting agent may be determined appropriately in accordance with the composition of the remedial agent and the insulating film.

Moreover, in order to suppress reactions that can impede the remedial treatment, the same effect as that obtained by using a penetration promoting agent can be achieved by first ensuring satisfactory diffusion of the remedial agent into the film interior at a temperature lower than the remedial treatment temperature, and subsequently heating the apparatus to the remedial treatment temperature.

By conducting the treatment so that the remedial treatment temperature from the point of supply of the remedial agent through to the point where the remedial treatment is actually conducted is controlled by a temperature controlling program composed of two or more steps, a very efficient remedial treatment can be executed. This operation may also be conducted in combination with the use of a penetration promoting agent.

Furthermore, following the deterioration by plasma treatment, the insulating film is preferably immediately subjected to the remedial treatment, without exposure to the atmosphere. Specifically, a method can be employed in which the remedial treatment is conducted inside the apparatus used for the plasma treatment, or alternatively, an apparatus can be used in which the plasma treatment apparatus and the remedial treatment apparatus are connected in an airtight arrangement, so that the plasma-treated substrate can be moved into the remedial treatment apparatus and then subjected to the remedial treatment.

In this type of method, because the remedial treatment is conducted without exposing the film to the external atmosphere, in the example of an insulating film composed of a Si-based material, organic groups such as methyl groups can be introduced at the active sites such as Si dangling bonds before silanol groups are formed within the film via reaction with moisture in the atmosphere, and therefore a very efficient remedial treatment can be performed.

In this type of remedial treatment, the Si dangling bonds within the insulating film react with the compound described above, organic group radicals such as methyl groups are released, and these organic group radicals then react with the Si dangling bonds, and the remedial treatment proceeds as these organic groups such as methyl groups bond to the Si.

The reaction equation for the case where dimethyl carbonate is used as the remedial agent is shown below.

$$Si + \tfrac{1}{4}(CH_3O)_2CO \rightarrow Si(CH_3) + \tfrac{1}{4}CO_2 + \tfrac{1}{8}O_2$$

As is evident from this reaction equation, the products of the reaction include carbon dioxide and oxygen, which are both gases at normal temperatures, and these gaseous products generate none of the adverse effects such as product accumulation on the copper wiring layer on the substrate.

Furthermore, in this remedial treatment, only those organic groups such as methyl groups that were cleaved and eliminated by the plasma treatment are replaced via new bonding to the Si dangling bonds. Furthermore, because the remedial agent is non-acidic, no oxidation of copper wiring layer occurs, and if the functional groups have reducing properties, then oxide films on copper wiring layer surfaces can also be removed.

The level of deterioration restoration provided by the present invention can be estimated by the evaluation of the dielectric constant. Various methods can be reported for measuring the dielectric constant, in the examples described below, a mercury probe method was used.

Furthermore, the relative amount of methyl group incorporation within the insulating film can also be evaluated by conducting infrared spectroscopic analyses before and after the remedial treatment. The absorbance of the insulating film prior to the remedial treatment is measured using a Fourier-transform infrared spectrometer, the absorbance of the insulating film following the remedial treatment is then measured in the same manner, and a differential spectrum can then be calculated to evaluate the relative amount of methyl group incorporation.

The graphs shown in FIG. 1 to FIG. 5 represent differential spectra for specific examples described below, and from the fact that the difference for the absorption attributable to the Si—$CH_3$ bond at a wavenumber of 1270 $cm^{-1}$ is positive, it is clear that methyl groups have been introduced into the insulating film.

EXAMPLES

Preparation 1 of Deteriorated Insulating Film

As a so-called dense low dielectric-constant film containing no intended pores within the film, a SiOCH film was used that was prepared by using a PE-CVD method to deposit an AURORA film (a trademark of ASM International N.V.) with a thickness of 500 nm on a Si wafer. Measurement of the dielectric constant of this film revealed a result of 2.8.

This low dielectric-constant film was subjected to a plasma treatment generated by an ICP method, thereby producing a plasma-deteriorated insulating film 1.

The plasma treatment conditions included using an oxygen flow of 50 sccm, and a pressure within the treatment chamber of 6.7 Pa. The RF power was 500 W, and the treatment time was one minute.

The dielectric constant for this plasma-deteriorated insulating film 1 was 3.9. Furthermore, measurement of the infrared absorption spectrum for the film using a Fourier-transform infrared spectrometer confirmed a reduction in the Si—$CH_3$ absorption peak at 1270 $cm^{-1}$.

Figure 6:
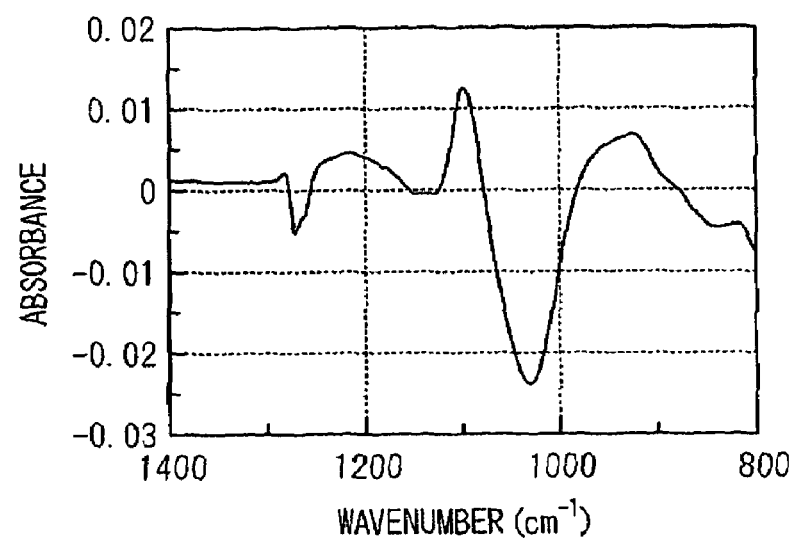
FIG. 6 is a differential IR spectrum obtained by subtracting the infrared absorption spectrum of a SiOCH film prior to plasma deterioration from the infrared absorption spectrum of an insulating film 1 that has undergone plasma deterioration.

FIG. 6 is a differential IR spectrum obtained by subtracting the infrared absorption spectrum of the SiOCH film prior to the plasma deterioration from the infrared absorption spectrum of the plasma-deteriorated insulating film 1.

Furthermore, the contact angle measured with pure water droplet when approximately 0.5 ml of pure water was dripped onto the surface of the insulating film was 30°, confirming a change to a hydrophilic state.

Preparation 2 of Deteriorated Insulating Film

As a dense low dielectric-constant film, a SiOCH film was used that was prepared by using a PE-CVD method to deposit an AURORA film with a thickness of 500 nm on a Si wafer. Measurement of the dielectric constant of this film revealed a result of 2.8.

This low dielectric-constant film was subjected to a plasma treatment generated by an ICP method, thereby producing a plasma-deteriorated insulating film 2.

The plasma treatment conditions included using an argon flow of 50 sccm, and a pressure within the treatment chamber of 6.7 Pa. The RF power was 500 W, and the treatment time was one minute.

The dielectric constant for this plasma-deteriorated insulating film 2 was 3.8. Furthermore, measurement of the infrared absorption spectrum for the film using a Fourier-transform infrared spectrometer confirmed a reduction in the Si—$CH_3$ absorption peak at 1270 $cm^{-1}$.

Figure 7:
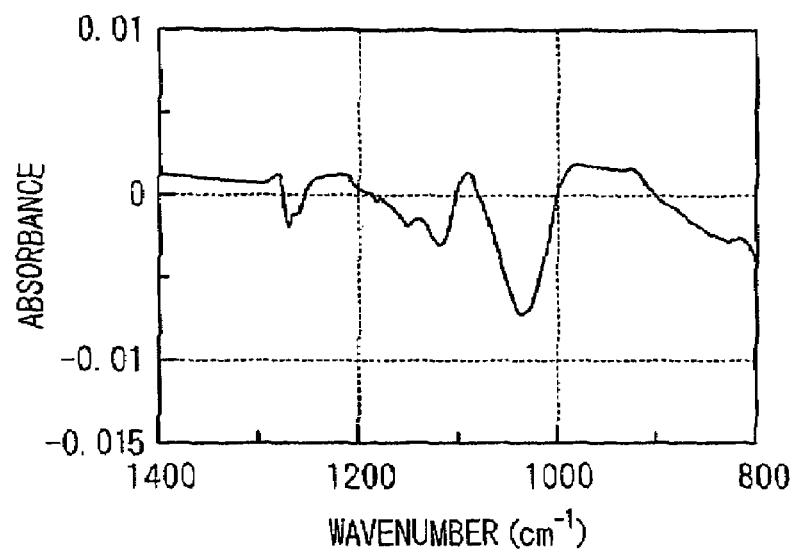
FIG. 7 is a differential IR spectrum obtained by subtracting the infrared absorption spectrum of a SiOCH film prior to plasma deterioration from the infrared absorption spectrum of an insulating film 2 that has undergone plasma deterioration.

FIG. 7 is a differential IR spectrum obtained by subtracting the infrared absorption spectrum of the SiOCH film prior to the plasma deterioration from the infrared absorption spectrum of the plasma-deteriorated insulating film 2.

Furthermore, the contact angle measured with pure water droplet when approximately 0.5 ml of pure water was dripped onto the surface of the insulating film 2 was 35°, confirming a change to a hydrophilic state.

Preparation 3 of Deteriorated Insulating Film

As a porous low dielectric-constant film, a SiOCH film was used that was prepared by using a PE-CVD method to deposit an AURORA film with a thickness of 500 nm on a Si wafer. Measurement of the dielectric constant of this film revealed a result of 2.5.

This low dielectric-constant film was subjected to a plasma treatment generated by an ICP method, thereby producing a plasma-deteriorated insulating film 3.

The plasma treatment conditions included using an oxygen flow of 50 sccm, and a pressure within the treatment chamber of 6.7 Pa. The RF power was 500 W, and the treatment time was one minute.

The dielectric constant for this plasma-deteriorated insulating film 3 was 3.5. Furthermore, measurement of the infrared absorption spectrum for the film using a Fourier-transform infrared spectrometer confirmed a reduction in the Si—$CH_3$ absorption peak at 1270 $cm^{-1}$.

Figure 8:
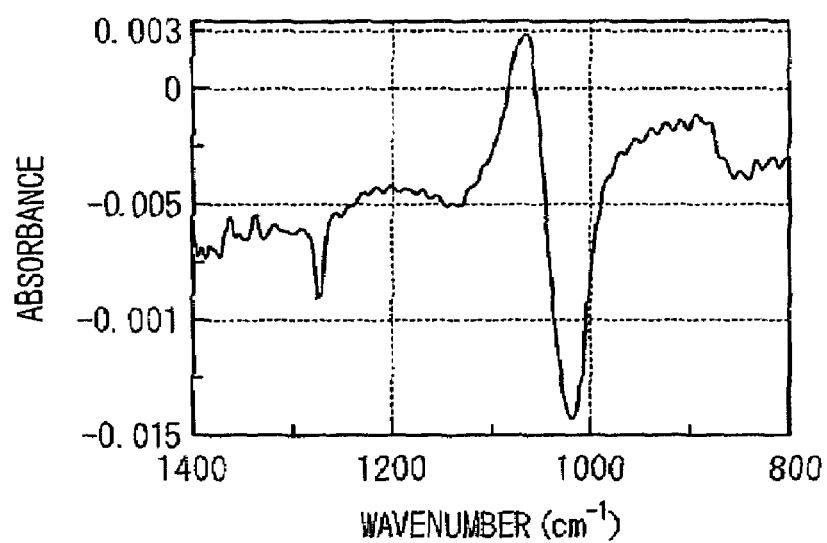
FIG. 8 is a differential IR spectrum obtained by subtracting the infrared absorption spectrum of a SiOCH film prior to plasma deterioration from the infrared absorption spectrum of an insulating film 3 that has undergone plasma deterioration.

FIG. 8 is a differential IR spectrum obtained by subtracting the infrared absorption spectrum of the SiOCH film prior to the plasma deterioration from the infrared absorption spectrum of the plasma-deteriorated insulating film 3.

Furthermore, the contact angle measured with pure water droplet when approximately 0.5 ml of pure water was dripped onto the surface of the insulating film 3 was 30°, confirming a change to a hydrophilic state.

Preparation 4 of Deteriorated Insulating Film

As a porous low dielectric-constant film, a SiOCH film was used that was prepared by using a PE-CVD method to deposit an AURORA film with a thickness of 500 nm on a Si wafer. Measurement of the dielectric constant of this film revealed a result of 2.5.

This low dielectric-constant film was subjected to a plasma treatment generated by an ICP method, thereby producing a plasma-deteriorated insulating film 4.

The plasma treatment conditions included using an argon flow of 50 sccm, and a pressure within the treatment chamber of 6.7 Pa. The RF power was 500 W, and the treatment time was one minute.

The dielectric constant for this plasma-deteriorated insulating film 4 was 3.4. Furthermore, measurement of the infrared absorption spectrum for the film using a Fourier-transform infrared spectrometer confirmed a reduction in the Si—$CH_3$ absorption peak at 1270 $cm^{-1}$.

Figure 9:
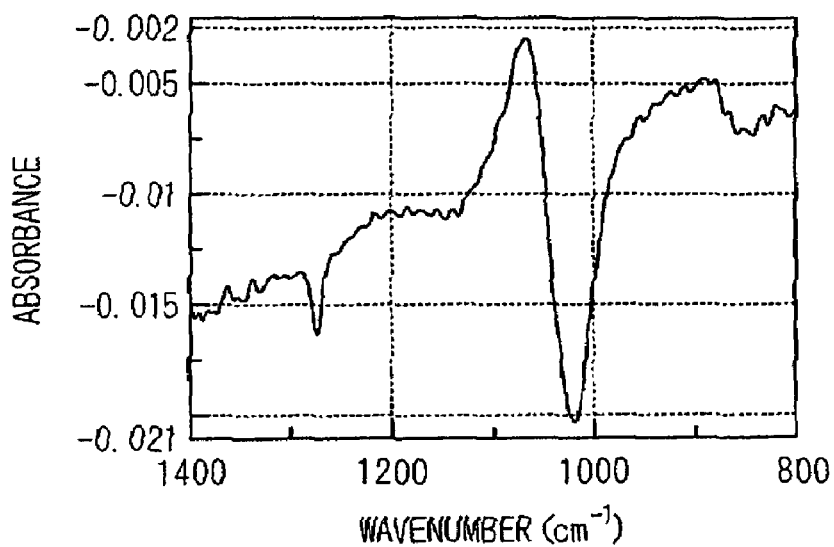
FIG. 9 is a differential IR spectrum obtained by subtracting the infrared absorption spectrum of a SiOCH film prior to plasma deterioration from the infrared absorption spectrum of an insulating film 4 that has undergone plasma deterioration.

FIG. 9 is a differential IR spectrum obtained by subtracting the infrared absorption spectrum of the SiOCH film prior to the plasma deterioration from the infrared absorption spectrum of the plasma-deteriorated insulating film 4.

Furthermore, the contact angle measured with pure water droplet when approximately 0.5 ml of pure water was dripped onto the surface of the insulating film 4 was 30°, confirming a change to a hydrophilic state.

Preparation 5 of Deteriorated Insulating Film

As a dense low dielectric-constant film, an organic film was used that had been formed with a thickness of 150 nm on a Si wafer using a spin-coating method. Measurement of the dielectric constant of this film revealed a result of 2.8.

This low dielectric-constant film was subjected to a plasma treatment generated by an ICP method, thereby producing a plasma-deteriorated insulating film 5.

The plasma treatment conditions included using an oxygen flow of 50 sccm, and a pressure within the treatment chamber of 6.7 Pa. The RF power was 500 W, and the treatment time was 0.5 minutes.

The dielectric constant for this plasma-deteriorated insulating film 5 was 4.5.

Specific examples are described below.

Example 1

Dimethyl carbonate was brought into contact with the insulating film 1 for 5 minutes under conditions including a substrate temperature of 180° C. The dielectric constant following contact was 2.9. Furthermore, measurement of the infrared absorption spectrum for the film using a Fourier-transform infrared spectrometer confirmed an increase in the Si—$CH_3$ absorption peak at 1270 $cm^{-1}$.

FIG. 1 is a differential IR spectrum obtained by subtracting the spectrum of the sample film that had been subjected to plasma deterioration from the spectrum of the sample film that had undergone the remedial treatment. In this remedial treatment, the recovery rate for methyl group yielded 20%.

Furthermore, the contact angle measured with pure water droplet when approximately 0.5 ml of pure water was dripped onto the surface of the insulating film that had undergone the remedial treatment was 100°, clearly indicating that the surface had been restored to a hydrophobic state. No change in the contact angle was observed even when the sample that had undergone the remedial treatment was stored for one day in the external atmosphere.

Example 2

Dimethyl carbonate was brought into contact with the insulating film 2 for 5 minutes under conditions including a substrate temperature of 180° C. The dielectric constant following contact was 2.8.

Example 3

Dimethyl carbonate was brought into contact with the insulating film 3 for 5 minutes under conditions including a substrate temperature of 180° C. The dielectric constant following contact was 2.7.

Example 4

Dimethyl carbonate was brought into contact with the insulating film 4 for 5 minutes under conditions including a substrate temperature of 180° C. The dielectric constant following contact was 2.6.

Example 5

Dimethyl carbonate was brought into contact with the insulating film 5 for 5 minutes under conditions including a substrate temperature of 180° C. The dielectric constant following contact was 3.3.

Example 6

2,2,6,6-tetramethyl-3,5-heptanedione (DPM) was brought into contact with the insulating film 1 for 5 minutes under conditions including a substrate temperature of 180° C. The dielectric constant following contact was 2.9. Furthermore, measurement of the infrared absorption spectrum for the film using a Fourier-transform infrared spectrometer confirmed an increase in the Si—CH$_3$ absorption peak at 1270 cm$^{-1}$.

Figure 2:
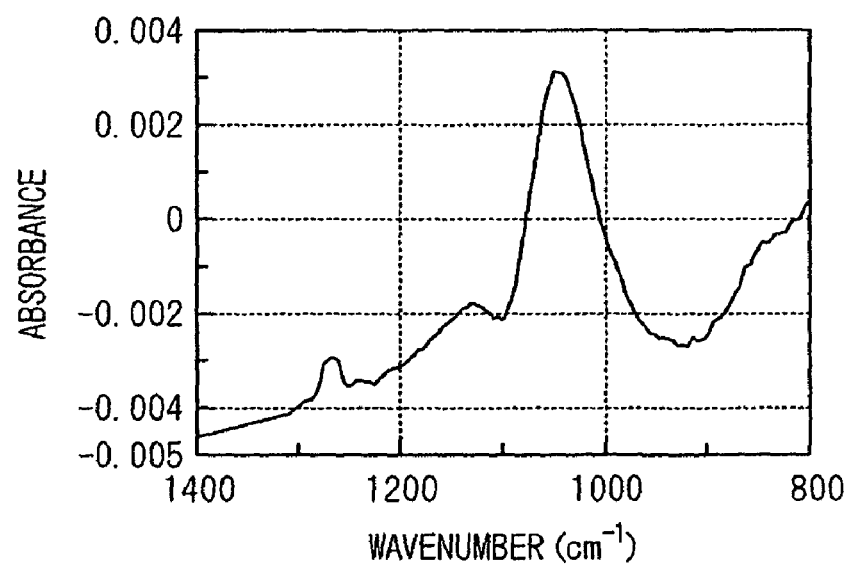
FIG. 2 is an IR spectrum showing results of Example 6.

FIG. 2 is a differential IR spectrum obtained by subtracting the spectrum of the sample film that had been subjected to plasma deterioration from the spectrum of the sample film that had undergone the remedial treatment. In this remedial treatment, the recovery rate for methyl group yielded 35%.

Furthermore, the contact angle measured with pure water droplet when approximately 0.5 ml of pure water was dripped onto the surface of the insulating film that had undergone the remedial treatment was 100°, clearly indicating that the surface had been restored to a hydrophobic state. No change in the contact angle was observed even when the sample that had undergone the remedial treatment was stored for one day in the external atmosphere.

Example 7

DPM was brought into contact with the insulating film 2 for 5 minutes under conditions including a substrate temperature of 180° C. The dielectric constant following contact was 2.8. Furthermore, measurement of the infrared absorption spectrum for the film using a Fourier-transform infrared spectrometer confirmed an increase in the Si—CH$_3$ absorption peak at 1270 cm$^{-1}$.

Figure 3:
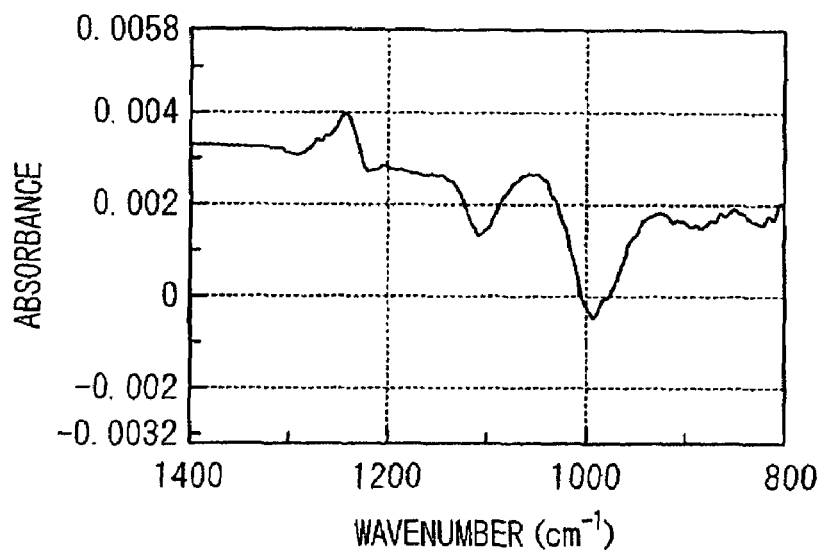
FIG. 3 is an IR spectrum showing results of Example 7.

FIG. 3 is a differential IR spectrum obtained by subtracting the spectrum of the sample film that had been subjected to plasma deterioration from the spectrum of the sample film that had undergone the remedial treatment. In this remedial treatment, the recovery rate for methyl group yielded 36%.

Furthermore, the contact angle measured with pure water droplet when approximately 0.5 ml of pure water was dripped onto the surface of the insulating film that had undergone the remedial treatment was 100°, clearly indicating that the surface had been restored to a hydrophobic state. No change in the contact angle was observed even when the sample that had undergone the remedial treatment was stored for one day in the external atmosphere.

Example 8

DPM was brought into contact with the insulating film 3 for 5 minutes under conditions including a substrate temperature of 180° C. The dielectric constant following contact was 2.5.

Figure 4:
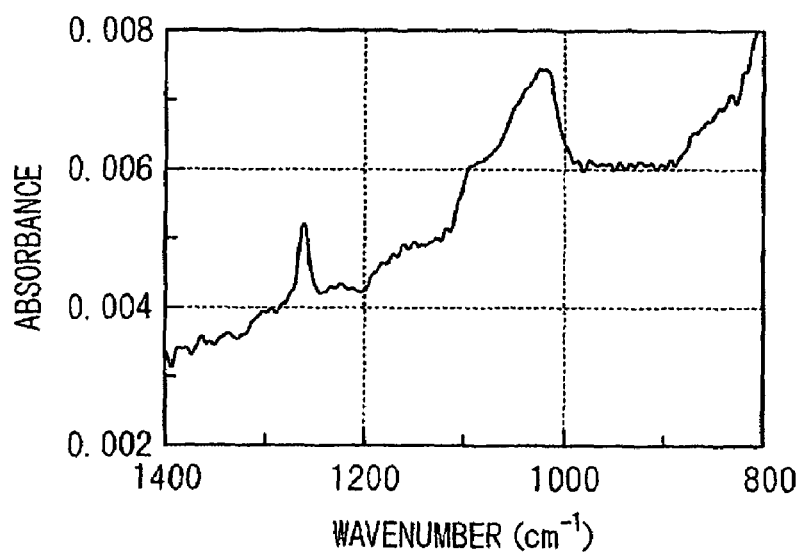
FIG. 4 is an IR spectrum showing results of Example 8.

FIG. 4 is a differential IR spectrum obtained by subtracting the spectrum of the sample film that had been subjected to plasma deterioration from the spectrum of the sample film that had undergone the remedial treatment. In this remedial treatment, the recovery rate for methyl group yielded 36%.

Example 9

DPM was brought into contact with the insulating film 4 for 5 minutes under conditions including a substrate temperature of 180° C. The dielectric constant following contact was 2.5.

Figure 5:
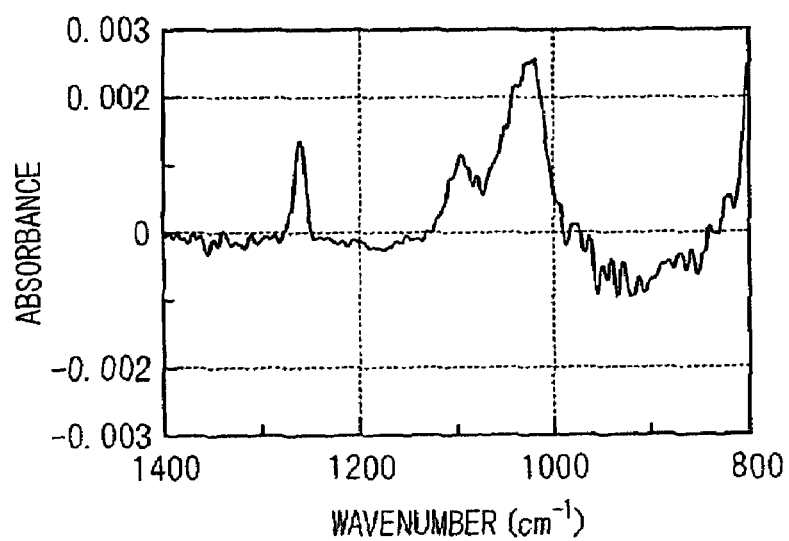
FIG. 5 is an IR spectrum showing results of Example 9.

FIG. 5 is a differential IR spectrum obtained by subtracting the spectrum of the sample film that had been subjected to plasma deterioration from the spectrum of the sample film that had undergone the remedial treatment. In this remedial treatment, the recovery rate for methyl group yielded 41%.

Example 10

DPM was brought into contact with the insulating film 5 for 5 minutes under conditions including a substrate temperature of 180° C. The dielectric constant following contact was 3.1.

Example 11

Hexafluoroacetylacetone was brought into contact with the insulating film 1 for 5 minutes under conditions including a substrate temperature of 180° C. The dielectric constant following contact was 3.0.

Furthermore, the contact angle measured with pure water droplet when approximately 0.5 ml of pure water was dripped onto the surface of the insulating film that had undergone the remedial treatment was 100°, clearly indicating that the surface had been restored to a hydrophobic state. No change in the contact angle was observed even when the sample that had undergone the remedial treatment was stored for one day in the external atmosphere.

Example 12

Hexafluoroacetylacetone was brought into contact with the insulating film 2 for 5 minutes under conditions including a substrate temperature of 180° C. The dielectric constant following contact was 3.0.

Furthermore, the contact angle measured with pure water droplet when approximately 0.5 ml of pure water was dripped onto the surface of the insulating film that had undergone the remedial treatment was 100°, clearly indicating that the surface had been restored to a hydrophobic state. No change in the contact angle was observed even when the sample that had undergone the remedial treatment was stored for one day in the external atmosphere.

Example 13

Hexafluoroacetylacetone was brought into contact with the insulating film 3 for 5 minutes under conditions including a substrate temperature of 180° C. The dielectric constant following contact was 2.9.

Example 14

Hexafluoroacetylacetone was brought into contact with the insulating film 4 for 5 minutes under conditions including a substrate temperature of 180° C. The dielectric constant following contact was 2.9.

Example 15

Hexafluoroacetylacetone was brought into contact with the insulating film 5 for 5 minutes under conditions including a substrate temperature of 180° C. The dielectric constant following contact was 3.3.

Example 16

Acetylacetone was brought into contact with the insulating film 1 for 5 minutes under conditions including a substrate temperature of 180° C. The dielectric constant following contact was 3.2.

Example 17

Acetylacetone was brought into contact with the insulating film 3 for 5 minutes under conditions including a substrate temperature of 180° C. The dielectric constant following contact was 3.1.

Example 18

Nitromethane was brought into contact with the insulating film 1 for 5 minutes under conditions including a substrate temperature of 180° C. The dielectric constant following contact was 3.3.

Example 19

Nitromethane was brought into contact with the insulating film 3 for 5 minutes under conditions including a substrate temperature of 180° C. The dielectric constant following contact was 3.3.

Example 20

Acetic anhydride was brought into contact with the insulating film 1 for 5 minutes under conditions including a substrate temperature of 180° C. The dielectric constant following contact was 3.2.

Example 21

Acetic anhydride was brought into contact with the insulating film 5 for 5 minutes under conditions including a substrate temperature of 180° C. The dielectric constant following contact was 3.4.

Example 22

Formic acid was brought into contact with the insulating film 5 for 5 minutes under conditions including a substrate temperature of 180° C. The dielectric constant following contact was 2.9.

Example 23

Formaldehyde was brought into contact with the insulating film 5 for 5 minutes under conditions including a substrate temperature of 180° C. The dielectric constant following contact was 2.8.

Example 24

Use of a Mixture of Two Remedial Agents

Equal quantities of dimethyl carbonate and 2,2,6,6-tetramethyl-3,5-heptanedione (DPM) were mixed together as the remedial agent, and this mixed remedial agent was brought into contact with the insulating film 1 for 5 minutes under conditions including a chamber pressure of 300 Pa and a film temperature of 180° C. The dielectric constant following contact was 2.9. Furthermore, measurement of the infrared absorption spectrum for the film using a Fourier-transform infrared spectrometer revealed no increase or decrease in the peak attributable to methyl groups.

Furthermore, the contact angle measured with pure water droplet when approximately 0.5 ml of pure water was dripped onto the surface of the insulating film that had undergone the remedial treatment was 80°, clearly indicating that the surface had been restored to a hydrophobic state. No change in the contact angle was observed even when the sample that had undergone the remedial treatment was stored for one day in the external atmosphere.

Example 25

Use of a Mixture of Two Remedial Agents

Equal quantities of dimethyl carbonate and 2,2,6,6-tetramethyl-3,5-heptanedione (DPM) were mixed together as the remedial agent, and this mixed remedial agent was brought into contact with the insulating film 2 for 5 minutes under conditions including a chamber pressure of 300 Pa and a film temperature of 180° C. The dielectric constant following contact was 2.9.

Example 26

Use of a Mixture of Two Remedial Agents

Equal quantities of dimethyl carbonate and 2,2,6,6-tetramethyl-3,5-heptanedione (DPM) were mixed together as the remedial agent, and this mixed remedial agent was brought into contact with the insulating film 3 for 5 minutes under conditions including a chamber pressure of 300 Pa and a film temperature of 180° C. The dielectric constant following contact was 2.5.

Example 27

Use of a Mixture of Two Remedial Agents

Equal quantities of dimethyl carbonate and 2,2,6,6-tetramethyl-3,5-heptanedione (DPM) were mixed together as the remedial agent, and this mixed remedial agent was brought into contact with the insulating film 4 for 5 minutes under conditions including a chamber pressure of 300 Pa and a film temperature of 180° C. The dielectric constant following contact was 2.5.

Example 28

Use of a Mixture of Two Remedial Agents

Equal quantities of dimethyl carbonate and 2,2,6,6-tetramethyl-3,5-heptanedione (DPM) were mixed together as the remedial agent, and this mixed remedial agent was brought into contact with the insulating film 5 for 5 minutes under conditions including a chamber pressure of 300 Pa and a film temperature of 180° C. The dielectric constant following contact was 3.0.

Example 29

Mixture of a Remedial Agent and a Penetration Promoting Agent

Equal quantities of 2,2,6,6-tetramethyl-3,5-heptanedione (DPM) as the remedial agent and isopropanol (IPA) as a penetration promoting agent were mixed together, and this mixture was brought into contact with the insulating film 1 for 5 minutes under conditions including a chamber pressure of 300 Pa and a film temperature of 180° C. The dielectric constant following contact was 2.8. Furthermore, measurement of the infrared absorption spectrum for the film using a Fourier-transform infrared spectrometer revealed no increase or decrease in the peak attributable to methyl groups.

Furthermore, the contact angle measured with pure water droplet when approximately 0.5 ml of pure water was dripped onto the surface of the insulating film that had undergone the remedial treatment was 80°, clearly indicating that the surface had been restored to a hydrophobic state. No change in the contact angle was observed even when the sample that had undergone the remedial treatment was stored for one day in the external atmosphere.

Example 30

Mixture of a Remedial Agent and a Penetration Promoting Agent

Equal quantities of 2,2,6,6-tetramethyl-3,5-heptanedione (DPM) as the remedial agent and isopropanol (IPA) as a penetration promoting agent were mixed together, and this mixture was brought into contact with the insulating film 2 for 5 minutes under conditions including a chamber pressure of 300 Pa and a film temperature of 180° C. The dielectric constant following contact was 2.8.

Example 31

Mixture of a Remedial Agent and a Penetration Promoting Agent

Equal quantities of 2,2,6,6-tetramethyl-3,5-heptanedione (DPM) as the remedial agent and isopropanol (IPA) as a penetration promoting agent were mixed together, and this mixture was brought into contact with the insulating film 3 for 5 minutes under conditions including a chamber pressure of 300 Pa and a film temperature of 180° C. The dielectric constant following contact was 2.5.

Example 32

Mixture of a Remedial Agent and a Penetration Promoting Agent

Equal quantities of 2,2,6,6-tetramethyl-3,5-heptanedione (DPM) as the remedial agent and isopropanol (IPA) as a penetration promoting agent were mixed together, and this mixture was brought into contact with the insulating film 4 for 5 minutes under conditions including a chamber pressure of 300 Pa and a film temperature of 180° C. The dielectric constant following contact was 2.5.

Example 33

Mixture of a Remedial Agent and a Penetration Promoting Agent

Equal quantities of 2,2,6,6-tetramethyl-3,5-heptanedione (DPM) as the remedial agent and isopropanol (IPA) as a penetration promoting agent r were mixed together, and this mixture was brought into contact with the insulating film 5 for 5 minutes under conditions including a chamber pressure of 300 Pa and a film temperature of 180° C. The dielectric constant following contact was 2.9.

Even in those cases where methanol, ethanol, tetrahydrofuran or ethylene glycol was used as the penetration promoting agent, the dielectric constant was restored and substantially the same effects as Examples 29 to 33 were obtained.

Example 34

Mixture of a Remedial Agent and a Penetration Promoting Agent

Equal quantities of dimethyl carbonate as the remedial agent and isopropanol (IPA) as a penetration promoting agent were mixed together, and this mixture was brought into contact with the insulating film 1 for 5 minutes under conditions including a chamber pressure of 300 Pa and a film temperature of 180° C. The dielectric constant following contact was 2.8. Furthermore, measurement of the infrared absorption spectrum for the film using a Fourier-transform infrared spectrometer revealed no increase or decrease in the peak attributable to methyl groups.

Furthermore, the contact angle measured with pure water droplet when approximately 0.5 ml of pure water was dripped onto the surface of the insulating film that had undergone the remedial treatment was 80°, clearly indicating that the surface had been restored to a hydrophobic state. No change in the contact angle was observed even when the sample that had undergone the remedial treatment was stored for one day in the external atmosphere.

Example 35

Mixture of a Remedial Agent and a Penetration Promoting Agent

Equal quantities of dimethyl carbonate as the remedial agent and isopropanol (IPA) as a penetration promoting agent were mixed together, and this mixture was brought into contact with the insulating film 2 for 5 minutes under conditions including a chamber pressure of 300 Pa and a film temperature of 180° C. The dielectric constant following contact was 2.8.

Example 36

Mixture of a Remedial Agent and a Penetration Promoting Agent

Equal quantities of dimethyl carbonate as the remedial agent and isopropanol (IPA) as a penetration promoting agent were mixed together, and this mixture was brought into contact with the insulating film 3 for 5 minutes under conditions including a chamber pressure of 300 Pa and a film temperature of 180° C. The dielectric constant following contact was 2.6.

Example 37

Mixture of a Remedial Agent and a Penetration Promoting Agent

Equal quantities of dimethyl carbonate as the remedial agent and isopropanol (IPA) as a penetration promoting agent were mixed together, and this mixture was brought into contact with the insulating film 4 for 5 minutes under conditions including a chamber pressure of 300 Pa and a film temperature of 180° C. The dielectric constant following contact was 2.5.

Example 38

Mixture of a Remedial Agent and a Penetration Promoting Agent

Equal quantities of dimethyl carbonate as the remedial agent and isopropanol (IPA) as a penetration promoting agent were mixed together, and this mixture was brought into contact with the insulating film 5 for 5 minutes under conditions including a chamber pressure of 300 Pa and a film temperature of 180° C. The dielectric constant following contact was 3.2.

Even in those cases where methanol, ethanol, tetrahydrofuran or ethylene glycol was used as the penetration promoting agent, the dielectric constant was restored and substantially the same effects as Examples 34 to 38 were obtained.

Comparative Example 1

An Example in which a Remedial Treatment was Conducted, but No Effect was Achieved Toluene was brought into contact with the insulating film 1 for 5 minutes under conditions including a film temperature of 300° C. The dielectric constant following contact was 3.9.

Comparative Example 2

An Example in which a Remedial Treatment was Conducted, but No Effect was Achieved Toluene was brought into contact with the insulating film 2 for 5 minutes under conditions including a film temperature of 300° C. The dielectric constant following contact was 3.8. Furthermore, measurement of the infrared absorption spectrum for the film using a Fourier-transform infrared spectrometer confirmed substantially no change in the Si—CH$_3$ absorption peak at 1270 cm$^{-1}$.

Figure 10:
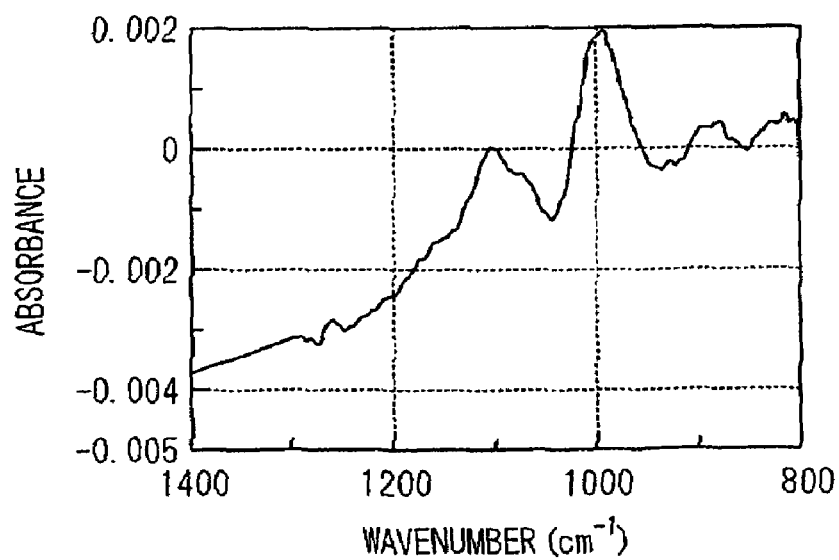
FIG. 10 is a differential IR spectrum obtained in Comparative Example 2 by subtracting the infrared absorption spectrum of an insulating film 2 that has undergone plasma deterioration from the infrared absorption spectrum of a sample film that has undergone remedial treatment.

FIG. 10 is a differential spectrum obtained by subtracting the spectrum of the sample film that had been subjected to plasma deterioration from the spectrum of the sample film that had undergone the remedial treatment. This remedial treatment showed no methyl group recovery effect.

Furthermore, the contact angle measured with pure water droplet when approximately 0.5 ml of pure water was dripped onto the surface of the insulating film 2 that had undergone the remedial treatment was 70°, indicating that the surface had been restored to a hydrophobic state. However, following storage for one day in the external atmosphere, the contact angle for the sample with pure water had fallen to 50°, indicating a change to a hydrophilic state.

Comparative Example 3

An Example in which a Remedial Treatment was Conducted, but No Effect was Achieved Toluene was brought into contact with the insulating film 3 for 5 minutes under conditions including a film temperature of 300° C. The dielectric constant following contact was 3.5.

Comparative Example 4

An Example in which a Remedial Treatment was Conducted, but No Effect was Achieved Toluene was brought into contact with the insulating film 4 that had been subjected to Ar plasma deterioration, for 5 minutes under conditions including a film temperature of 300° C. The dielectric constant following contact was 3.4. Furthermore, measurement of the infrared absorption spectrum for the film using a Fourier-transform infrared spectrometer confirmed substantially no change in the Si—CH$_3$ absorption peak at 1270 cm$^{-1}$.

Figure 11:
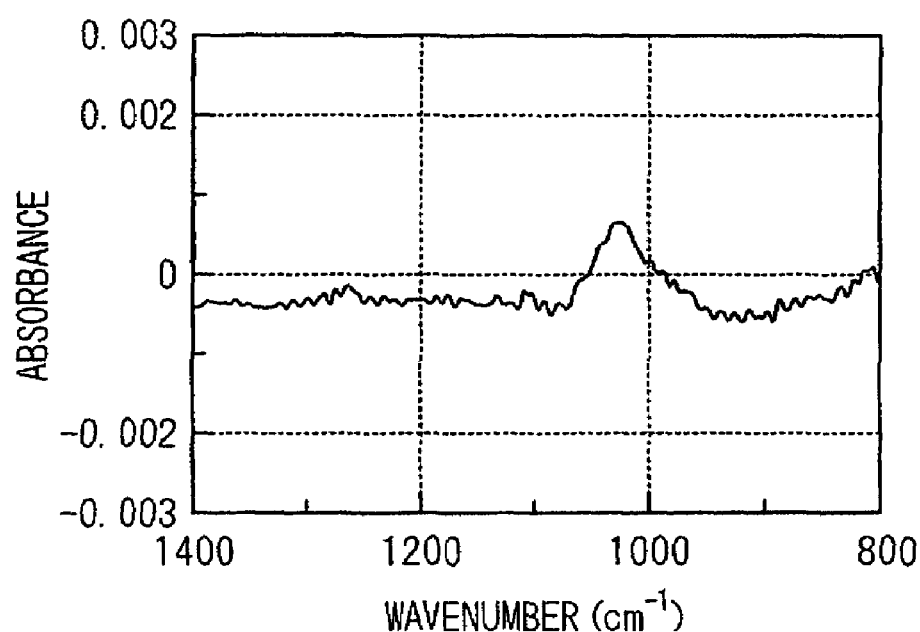
FIG. 11 is a differential IR spectrum obtained in Comparative Example 4 by subtracting the infrared absorption spectrum of an insulating film 4 that has undergone plasma deterioration from the infrared absorption spectrum of a sample film that has undergone remedial treatment.

FIG. 11 is a differential IR spectrum obtained by subtracting the spectrum of the sample film that had been subjected to plasma deterioration from the spectrum of the insulating film 4 that had undergone the remedial treatment. This remedial treatment showed no methyl group recovery effect.

Furthermore, the contact angle measured with pure water droplet when approximately 0.5 ml of pure water was dripped onto the surface of the insulating film 4 that had undergone the remedial treatment was 70°, indicating that the surface had been restored to a hydrophobic state. However, following storage for one day in the external atmosphere, the contact angle for the insulating film 4 with pure water had fallen to 30°, indicating a change to a hydrophilic state.

Comparative Example 5

An Example in which a Remedial Treatment was Conducted, but No Effect was Achieved Toluene was brought into contact with the insulating film 5 for 5 minutes under conditions including a film temperature of 300° C. The dielectric constant following contact was 4.5.

Comparative Example 6

An Example in which a Remedial Treatment was Conducted, but No Effect was Achieved Methanol was brought into contact with the insulating film 1 for 5 minutes under conditions including a film temperature of 180° C. The dielectric constant following contact was 3.9.

Comparative Example 7

An Example in which a Remedial Treatment was Conducted, but No Effect was Achieved Methanol was brought into contact with the insulating film 2 for 5 minutes under conditions including a film temperature of 180° C. The dielectric constant following contact was 3.8.

Comparative Example 8

An Example in which a Remedial Treatment was Conducted, but No Effect was Achieved Methanol was brought into contact with the insulating film 3 for 5 minutes under conditions including a film temperature of 180° C. The dielectric constant following contact was 3.5.

Comparative Example 9

An Example in which a Remedial Treatment was Conducted, but No Effect was Achieved Methanol was brought into contact with the insulating film 4 that had been subjected to Ar plasma deterioration, for 5 minutes under conditions including a film temperature of 180° C. The dielectric constant following contact was 3.4.

Comparative Example 10

An Example in which a Remedial Treatment was Conducted, but No Effect was Achieved Methanol was brought into contact with the insulating film 5 for 5 minutes under conditions including a film temperature of 180° C. The dielectric constant following contact was 4.5.

INDUSTRIAL APPLICABILITY

The present invention can be applied to a method of treating an interlayer insulating film used in a multilayer wiring structure of a semiconductor device such as a Si LSI Logic device, and can be applied particularly favorably to a method of remedying deterioration of an insulating film, wherein deterioration (damage) of the electrical properties and film structure of the film caused by an etching treatment, ashing treatment or some other form of plasma treatment can be restored to the state that existed prior to the plasma treatment.

The invention claimed is:

1. A method of remedying deterioration of an insulating film, comprising:

bringing an insulating film that has been deteriorated by plasma treatment into contact with at least one remedial agent comprising a compound which is selected from the group consisting of dimethyl carbonate, 2,2,6,6-tetramethyl-3,5-heptanedione, acetylacetone and nitromethane.

2. The method of remedying deterioration of an insulating film according to claim 1, wherein following plasma treatment, a substrate having said insulating film is subjected to a remedial treatment without exposure to an external atmosphere.

3. The method of remedying deterioration of an insulating film according to claim 1, wherein a penetration promoting agent is brought into contact with said deteriorated insulating film, either prior to, or simultaneously with, a remedial treatment.

4. The method of remedying deterioration of an insulating film according to claim 3, wherein said penetration promoting agent is at least one compound selected from the group consisting of alcohol compounds and ether compounds.

5. A remedial agent for an insulating film, comprising a compound which is selected from the group consisting of dimethyl carbonate, 2,2,6,6-tetramethyl-3,5-heptanedione, acetylacetone and nitromethane.

* * * * *